Figure 1:
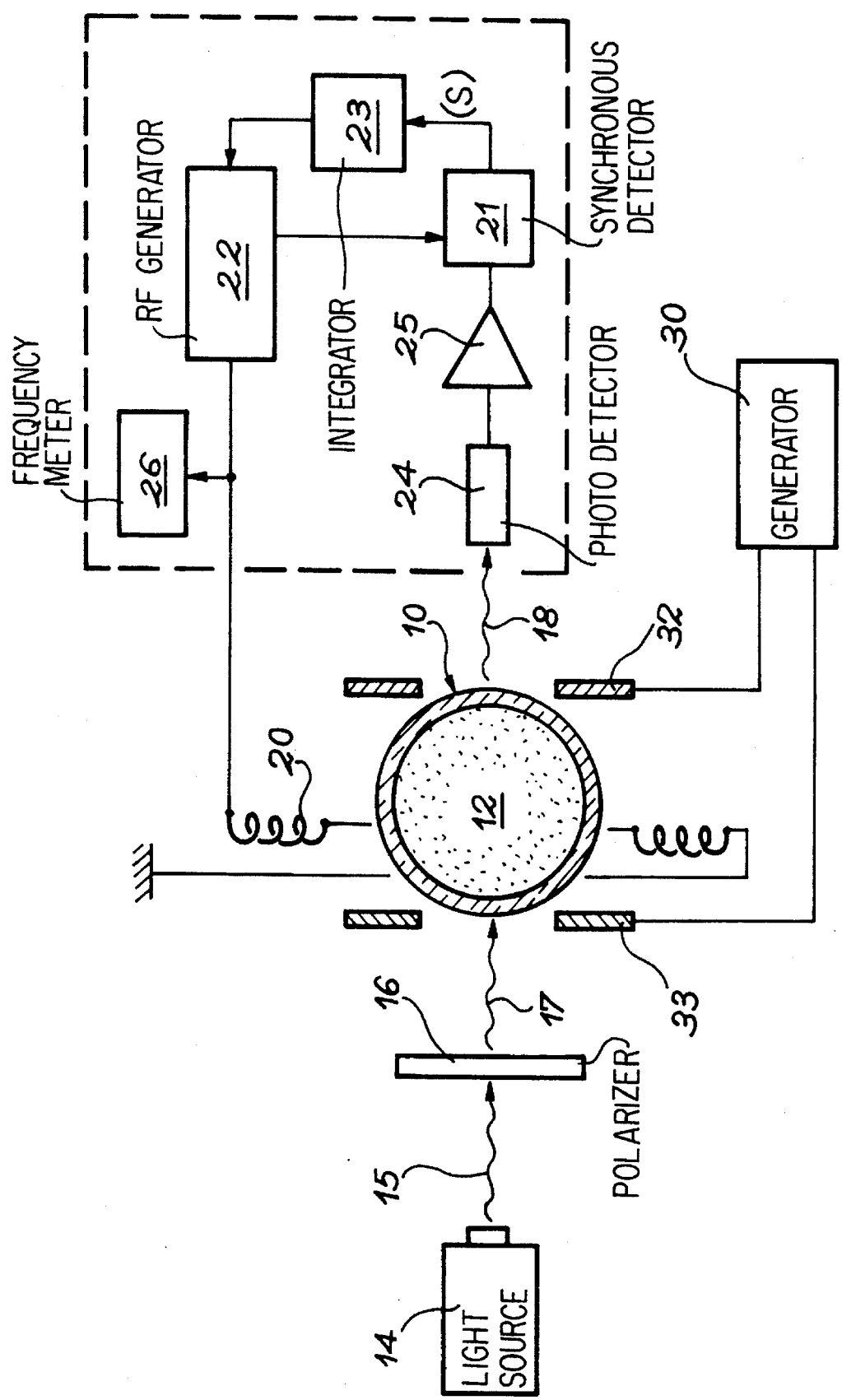

United States Patent [19]

Leger et al.

[11] Patent Number: 5,534,776
[45] Date of Patent: Jul. 9, 1996

[54] COUPLED RADIO FREQUENCY FIELD AND LIGHT POLARIZATION MAGNETOMETER

[75] Inventors: Jean-Michel Leger, Neylan; Christophe Guttin, Virien, both of France

[73] Assignee: Commissariat A l'Energie Atomique, Paris, France

[21] Appl. No.: 347,244

[22] Filed: Nov. 23, 1994

[30] Foreign Application Priority Data

Dec. 1, 1993 [FR] France .................................. 93 14378

[51] Int. Cl.$^6$ ...................................................... G01V 3/00
[52] U.S. Cl. ........................................... 324/304; 324/301
[58] Field of Search .................................. 324/304, 301, 324/300, 305, 307, 309

[56] References Cited

U.S. PATENT DOCUMENTS

| | | |
|---|---|---|
| 4,327,327 | 4/1982 | Greenwood et al. . |
| 4,780,672 | 10/1988 | McGregor ........................ 324/304 |
| 4,806,864 | 2/1989 | Schearer et al. . |
| 5,225,778 | 7/1993 | Chaillout et al. . |
| 5,227,722 | 7/1993 | Kastyk et al. ....................... 324/304 |
| 5,254,947 | 10/1993 | Chaillout et al. . |
| 5,357,199 | 10/1994 | Leger et al. . |

FOREIGN PATENT DOCUMENTS

| | | |
|---|---|---|
| 0461999 | 12/1991 | European Pat. Off. . |
| 2668862 | 5/1992 | France . |
| 964028 | 7/1964 | United Kingdom . |

OTHER PUBLICATIONS

IEEE Transactions on Magnetics, vol. MAG–8, No. 1, Mar. 1972, Francis Hartmann, "Resonance Magnetometers", pp. 66–75.

Optics Communications, vol. 81, No. 6, Mar. 15, 1991, H. Gilles, et al., "4HE Optical Pumping With Polarization Modulated Light", pp. 369–374.

*Primary Examiner*—Louis M. Arana
*Attorney, Agent, or Firm*—Oblon, Spivak, McClelland, Maier & Neustadt

[57] ABSTRACT

A coupled radio frequency field and light polarization magnetometer. The polarization direction P and the direction of the radio frequency field $B_1$ are kept parallel to one another and perpendicular to the field $B_0$ which is to be measured. The polarizer is connected to the coil, which produces $B_1$, and the assembly is rotated by a piezoelectric motor.

5 Claims, 6 Drawing Sheets

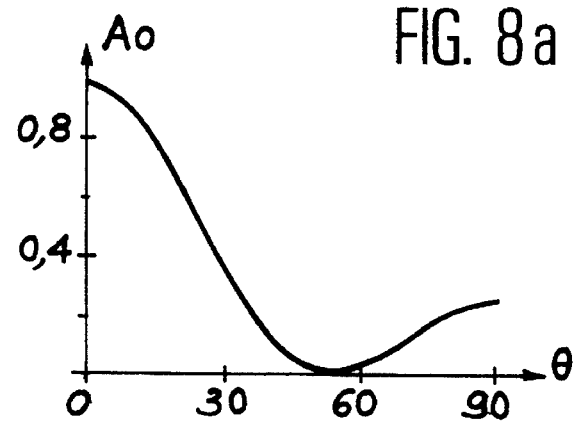
FIG. 8a
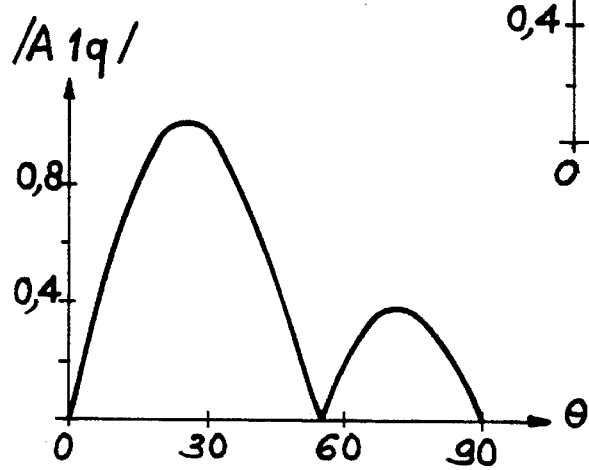
FIG. 8b
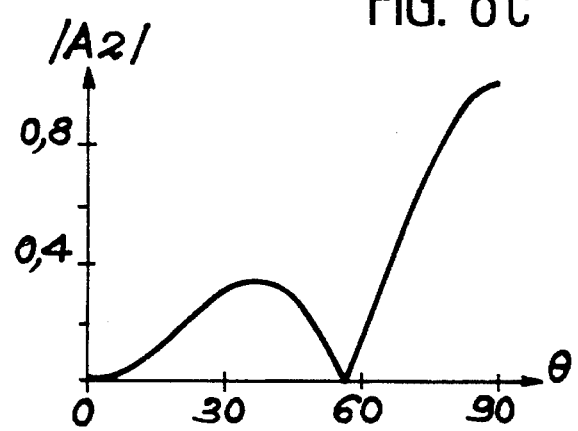
FIG. 8c
FIG. 8d
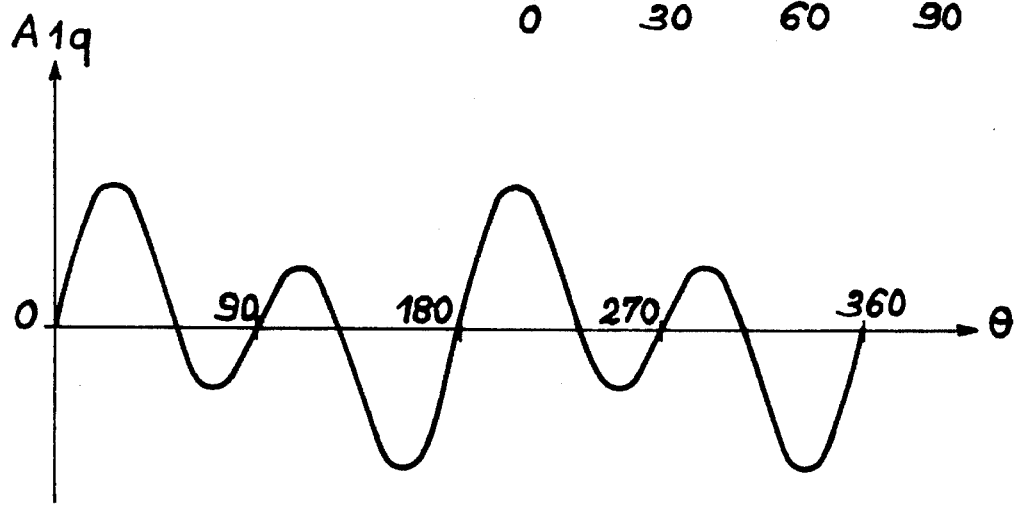

COUPLED RADIO FREQUENCY FIELD AND LIGHT POLARIZATION MAGNETOMETER

TECHNICAL FIELD

The present invention relates to a coupled radio frequency field and light polarization magnetometer. It is used in the precise measurement of weak magnetic fields (typically in the range 20 to 70 µT corresponding to the values of the geomagnetic field).

PRIOR ART

The magnetometer according to the invention enters into the category of so-called resonance magnetometers, whereof a general description is provided in the article by F. Hartman entitled "Resonance Magnetometers", published in the journal IEEE Transactions on Magnetics, vol. MAG-8, no.1, March 1972, pp.66–75.

A resonance magnetometer is an apparatus which, when introduced into a magnetic field $\vec{B}_0$ supplies an electric signal of frequency F, whose value is linked with Bo by the so-called Larmor relation:

$$F=\gamma Bo$$

in which $\gamma$ is a gyromagnetic ratio of an electron or a nucleon, as a function of the substance used. For example, for the electron said ratio is 28 Hz/nT.

The magnetic resonance is excited by a winding placed around the substance used. The sampling of the resonance signal takes place either by another winding (electrical variant) or by a pumping light beam (optical variant). The present invention relates to the second variant.

FR-A-2 663 430 describes an optical pumping magnetometer diagrammatically shown in FIG. 1. An at least partly transparent cell 10 is filled with a gas 12, generally helium, at a pressure of 1 to a few Torr. A light source 4 supplies a light beam 15, whose wavelength is around 1.1 µm. This beam passes through a linear polarizer 16. The resulting polarized beam 17 passes through the cell 10 and emerges in the form of a beam 18.

Moreover, a so-called weak or gentle radio frequency discharge is produced in the gas 12 by a generator 50 connected to two electrodes 32, 33 placed around the cell 10. This discharge produces atoms in a metastable state ($2^3S_1$ in the case of helium). The incident light beam 17 "pumps" these atoms from the metastable state and brings them into another excited state ($2^3$ P).

In the presence of a magnetic field $\vec{B}_o$, the energy levels are subdivided into so-called Zeeman sublevels. A resonance between such sublevels can be established by a radio frequency field.

This resonance is revealed by various known means and whereof one variant is shown in FIG. 1. It is a winding 20 placed on either side of the cell 10 (in a so-called Helmholtz arrangement) of a radio frequency generator 22, a photodetector 24 receiving the emergent light radiation 18, an amplifier 25 connected to the photodetector 24, a synchronous detector 21 receiving a reference signal from the generator 22 and an integrator 23.

The generator 22 supplies current at the frequency F to the winding 20, which creates an oscillating magnetic field, whereof one component maintains the resonance and modulates in return the light beam 18 which has passed through the cell 10. This modulation reappears in the electric signal supplied by the photodetector 24 and is detected by the synchronous detector 21. The signal supplied by the synchronous detector 21 has a component in phase with the reference signal and said component serves as an error signal. The integrator 23 eliminates the static error therefrom. This error signal adjusts the frequency F of the frequency generator 22 in order to cancel out the error signal. Thus, it must be possible to voltage-control this generator. It can e.g. be a voltage controlled oscillator or VCO.

Thus, an electric resonance signal is established in this loop and said signal is at the Larmor frequency. A frequencymeter 26 gives the value F thereof. The field to be measured $\vec{B}_0$ is deduced therefrom by the relation B0=F/$\gamma$.

Magnetometers of this type were firstly used in helium lamps. The recent obtaining of lanthanum—neodymium aluminate crystals (or LNA) has made it possible to produce lasers tunable around the wavelength 1.083 µm precisely corresponding to the optical pumping line of helium, so that this type of laser has naturally taken the place of said lamps with a significant improvement in the performance characteristics, so that such magnetometers have been the subject of renewed interest. Such a magnetometer equipped with a LNA laser is described in FR-A-2 598 518.

Although satisfactory in certain respects, such magnetometers suffer from disadvantages. Thus, they are highly anisotropic and this occurs both in amplitude and in frequency. These anisotropies are either the consequences of the optical pumping cycle and the detection of the transmitted light intensity, or are linked with the magnetic resonance phenomenon.

The aforementioned FR-A-2 66B 430 proposes a solution to this problem. It consists of providing the magnetometer with means permitting the rotation of the linear polarization direction of the light beam 17 injected into the cell 10 in order to give it the optimum direction corresponding to a maximum amplitude of the resonance signal.

Several means can be used for determining and obtaining said optimum direction. In a first variant, the magnetometer comprises a directional magnetometer, such as e.g. an assembly of three flux gates or an electronic paramagnetic resonance or EPR magnetometer, in order to obtain information on the direction of the ambient field to be measured. A circuit for processing said information calculates the optimum orientation of the polarization and as a consequence thereof controls the rotation of the polarizer.

In a second variant, the magnetometer comprises means for the low frequency modulation of the polarization direction and for carrying out a synchronous detection of the resonance signal. The detected signal serves as an error signal for correcting the polarization and for giving it the optimum direction.

Although satisfactory in certain respects, these solutions suffer from the disadvantage of complexity, particularly in the variant having combined flux gates. The polarization modulation variant also has the disadvantage of reducing the passband of the magnetometer, because the maximum analysis frequency is necessarily below that of the modulation.

A solution to these problems was proposed in French patent application 92 08783 of Jul. 16, 1992 entitled "Coupled radio frequency field and light polarization magnetometer". This application has an anisotropy-free magnetometer with respect to amplitude or frequency and makes no use of a modulation of the light polarization or associated directional magnetometers. This result is obtained by directionally coupling the polarization $\vec{P}$ of the incident light beam in a direction perpendicular to the ambient magnetic field $\vec{B}_0$ to be measured and simultaneously by coupling the direction of the radio frequency magnetic field $\vec{B}_1$ parallel to the polarization direction $\vec{P}$. In other words, the polarization direction $\vec{P}$ and that of the radio frequency field $\vec{B}_1$ are both oriented in the same optimum direction, no matter what the direction of the magnetic field to be measured.

Figure 2:
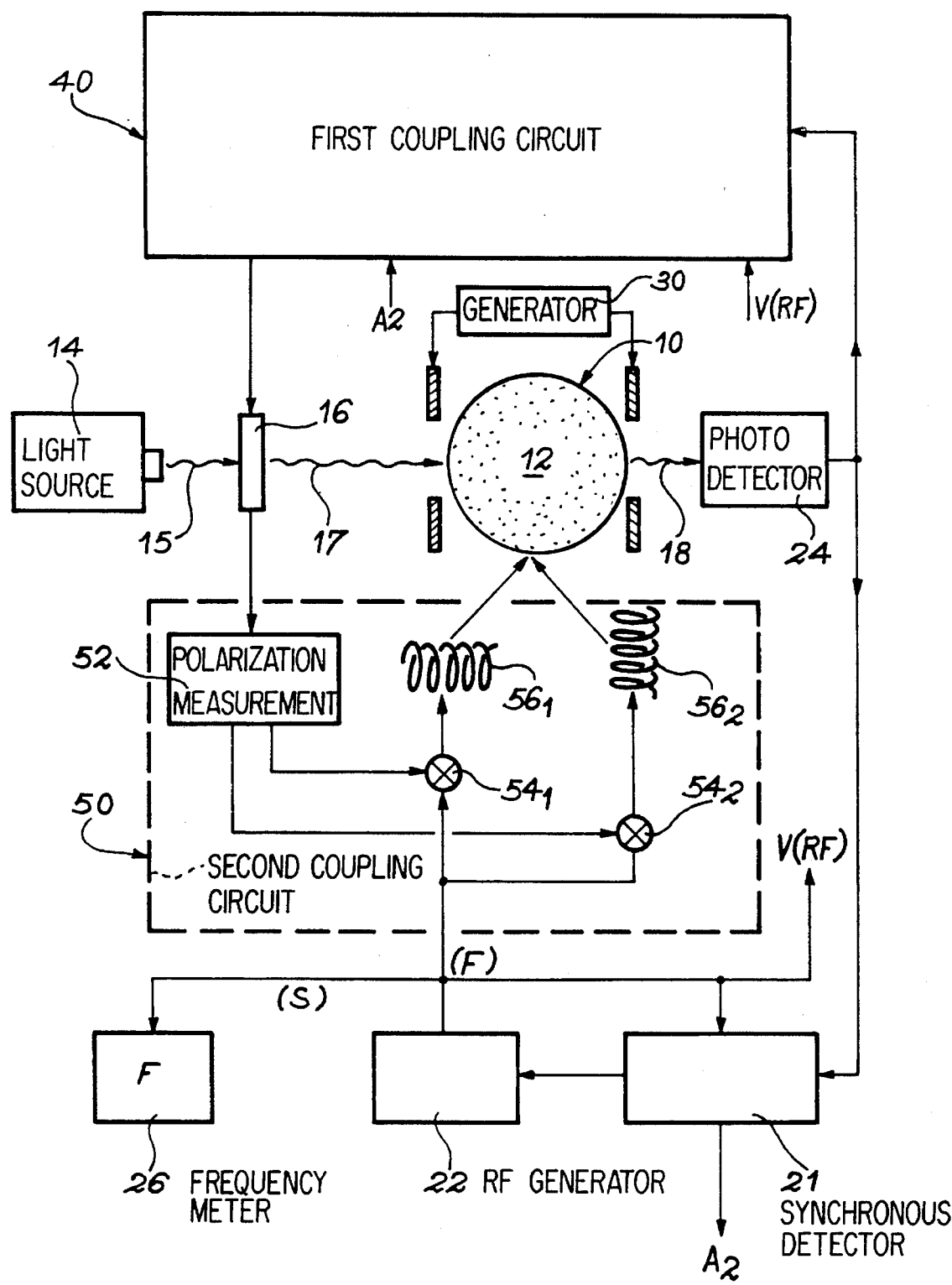

This type of magnetometer is illustrated in FIG. 2, which has means already described relative to FIG. 1 and which for this reason have the same references. They consist of the cell 10 filled with gas 12, the laser 14 emitting a beam 15, the polarizer 16 supplying a linear polarization beam 17, the photodetector 24 receiving the emergent beam 18, the frequency coupling circuit 21, the radio frequency generator 22, the frequency meter 26 and the discharge circuit 30.

This magnetometer also has a first coupling circuit 40, which controls the angular position θ of the polarizer.

It also has a coupling circuit 50 of the radio frequency field $\vec{B}_1$ comprising:
- a system for measuring and encoding the angle θ of polarization 52,
- two multipliers $54_1$, $54_2$ receiving on the one hand said signals and on the other the radio frequency signal supplied by the generator 22,
- two windings $56_1$, $56_2$ having orthogonal axes and to which are connected the outputs of the two multipliers 54 and $54_2$.

By injecting into the windings currents $i_1=i\cos\theta$ and $i_2=i\sin\theta$, it is possible to adjust the direction of $\vec{B}_1$ to that of the polarization $\vec{P}$.

This arrangement generates several types of errors which modify or affect the angle $(\vec{P}, \vec{B}_1)$, which it is desired to maintain constant and equal to 0°, because when the two directions $\vec{P}$ and $\vec{B}_1$ are perpendicular to $\vec{B}_0$, there is an optimum operation of the magnetometer. These errors result from:

1. errors during the encoding of the angle θ (by the system 52, cf. FIG. 2) and it is in fact necessary to have a precision of the coder of approximately of 1 millidegree, which is unrealistic because it is too complex to put into effect,
2. an error on the orthogonality of the coils $56_1$ and $56_2$, which must be kept strictly perpendicular,
3. errors or variations of the current transfer functions supplied to the coils/field produced by the coils.

However, it has been found that modifications to the angle $(\vec{P}, \vec{B}_1)$ lead to variations in the phase of the resonance signal used for measuring the Larmor frequency. Thus, a 1° variation of said phase leads to a frequency shift of the magnetometer of approximately 1 nanotesla, whereas the sensitivity to be achieved is approximately 1 picotesla.

Although satisfactory in certain respects, the magnetometer proposed by FR-92 08783 still has certain disadvantages.

DESCRIPTION OF THE INVENTION

The present invention aims at obviating the disadvantages described hereinbefore. To this end it provides a magnetometer which is free from frequency or amplitude anisotropy and which makes no use of a modulation of the light polarization or associated directional magnetometers. This result is obtained by the directional coupling of the polarization of the incident light beam in a direction perpendicular to the ambient magnetic field Bo to be measured and simultaneously by coupling the direction of the radio frequency magnetic field parallel to the polarization direction. In other words, the polarization direction and that of the radio frequency field are both oriented in the same optimum direction, no matter what the direction of the magnetic field to be measured.

More specifically, the present invention relates to a optical pumping, resonance magnetometer comprising a cell filled with a gas, whereof the atoms have a gyromagnetic ratio θ, said cell being placed in an ambient magnetic field $\vec{B}_o$, which is the field to be measured, a light source emitting a light beam, a linear polarizer through which said beam passes and giving said beam a linear polarization in a first direction, the linearly polarized beam then passing through the cell, a photodetector receiving the light beam which has passed through the cell, said photodetector supplying an electric signal, means for applying a radio frequency field $\vec{B}_1$ to the cell, said field having a second direction and a certain frequency, means for coupling said frequency to the Larmor frequency $F=\theta\vec{B}_o$, a means for measuring said frequency, the amplitude of the ambient magnetic field $\vec{B}_0$ being deduced from the frequency F by the relation $Bo=F\gamma$, said magnetometer also comprising means for mechanically joining to the polarizer the means for applying the radio frequency field $\vec{B}_1$ to the cell and coupling means acting on the mechanical joining means, said means having a synchronous detection circuit receiving the electric signal supplied by the photodetector and a reference voltage ($V_{RF}$) at the frequency F of the radio frequency signal, said circuit detecting the amplitude ($A_{1\ q}$) of the component at frequency F in phase quadrature with the reference signal ($V_{RF}$), said amplitude being used for controlling means for rotating the mechanical joining means of the polarizer with means for applying the radio frequency field to the cell.

The invention, as defined hereinbefore, has the advantage of considerable simplicity compared with the magnetometer described in FR-A-2 663 430. Thus, it requires no modulation of the light polarization or an associated directional magnetometer.

Compared with the solution proposed in FR-92 08783, any possible source of error associated either with the encoding of the angular rotation of the polarizer and its transmission to the coils, or any other error source leading to phase variations on the detected signals is eliminated. Thus, in the present invention, the polarizer and the generating means of the radio frequency field are joined to one another and the rotation of said components is simultaneous. It is therefore certain that the same angle, preferably 0°, will be maintained between the polarization direction on the one hand and the direction of the radio frequency field $\vec{B}_1$ on the other.

From this results a phase error which has no consequence for the magnetometer to the extent that only variations of the magnetic field and not its absolute value are of interest.

Preferably, said magnetometer is also characterized in that the synchronous detection circuit verifies that the amplitude ($A_2$) of the signal at the double frequency is not zero.

According to a special embodiment, such a magnetometer is also characterized in that the linear polarization direction of the beam is parallel to the direction of the radio frequency field.

According to another special embodiment, a magnetometer according to the invention is also characterized in that the radio frequency generating means are constituted by a single coil.

The use of a single coil provides a further simplification compared with FR-A-2 663 430, because an embodiment of a magnetometer was proposed therein, where three exciting windings are arranged around the cell, said windings being put into service sequentially with respect to a multiplexer.

Finally, according to another embodiment, the magnetometer according to the invention is characterized in that the means for rotating the polarizer and the means for applying the radio frequency field are constituted by a piezoelectric motor.

The choice of a piezoelectric motor was guided by the fact that it was necessary to find a motor both sufficiently powerful for rotating the polarizer - radio frequency coil assembly, whilst respecting the highly restrictive constraints of amagnetism.

The invention is described in greater detail hereinafter relative to non-limitative embodiments and with reference to the attached drawings, wherein show:

FIG. 1 Already described, a prior art magnetometer.

FIG. 2 Already described, an embodiment of a magnetometer according to the prior art.

Figure 3:
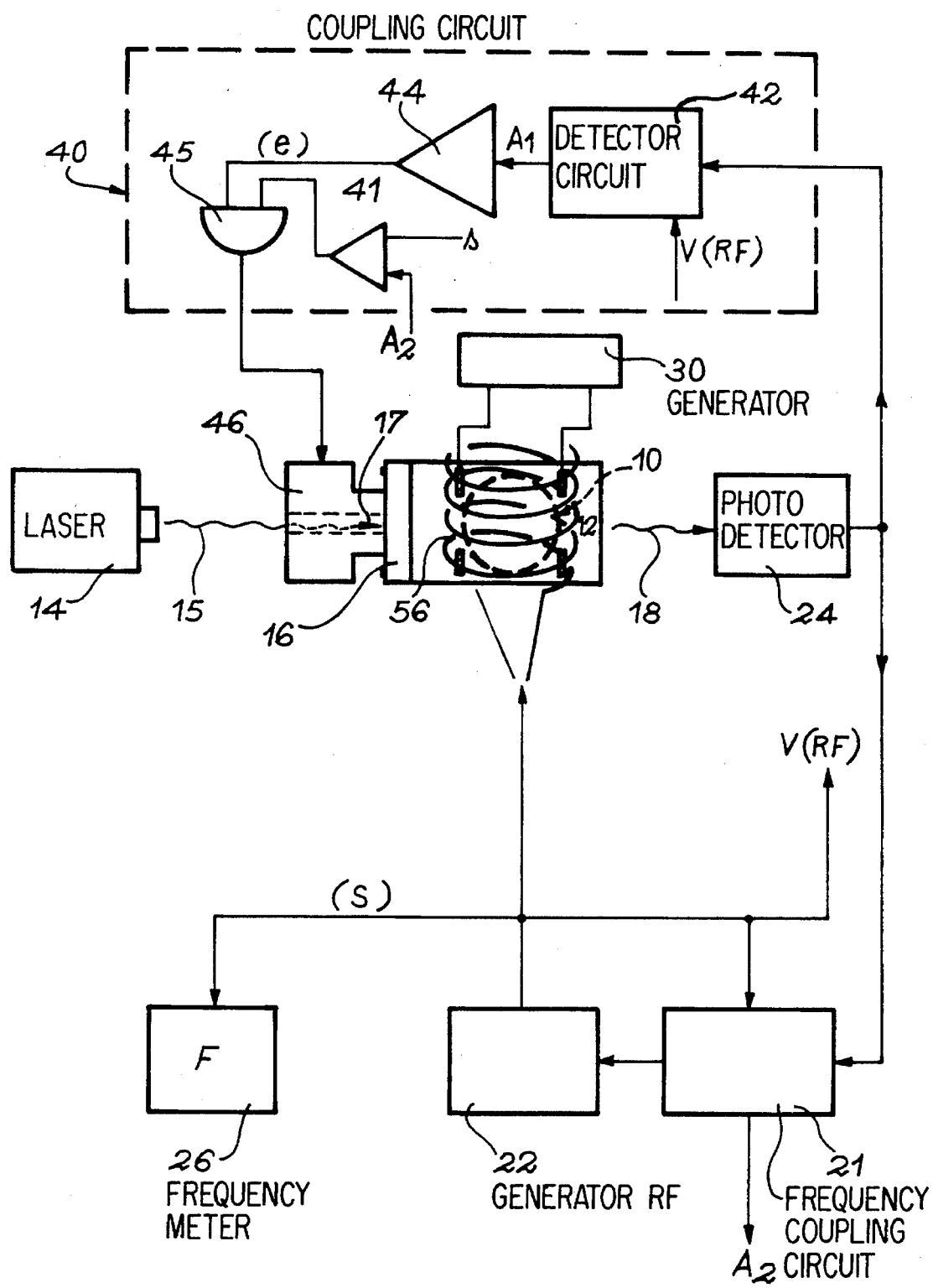

FIG. 3 An embodiment of a magnetometer according to the invention.

Figure 4:
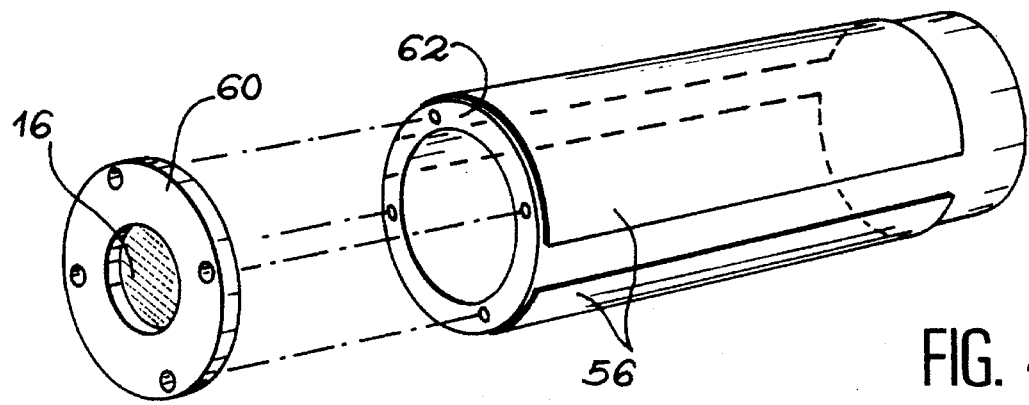

FIG. 4 A polarizer—coil arrangement in a magnetometer according to the invention.

Figure 5A:
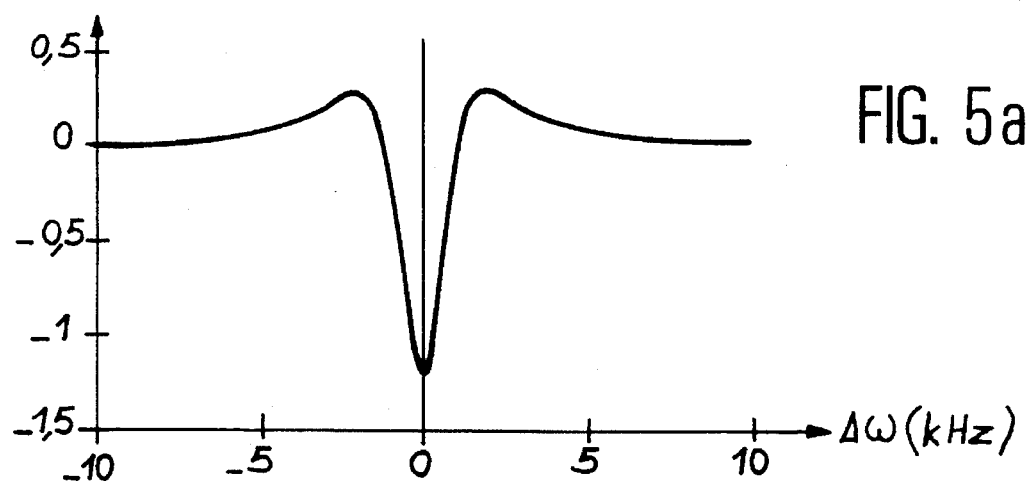
Figure 5B:
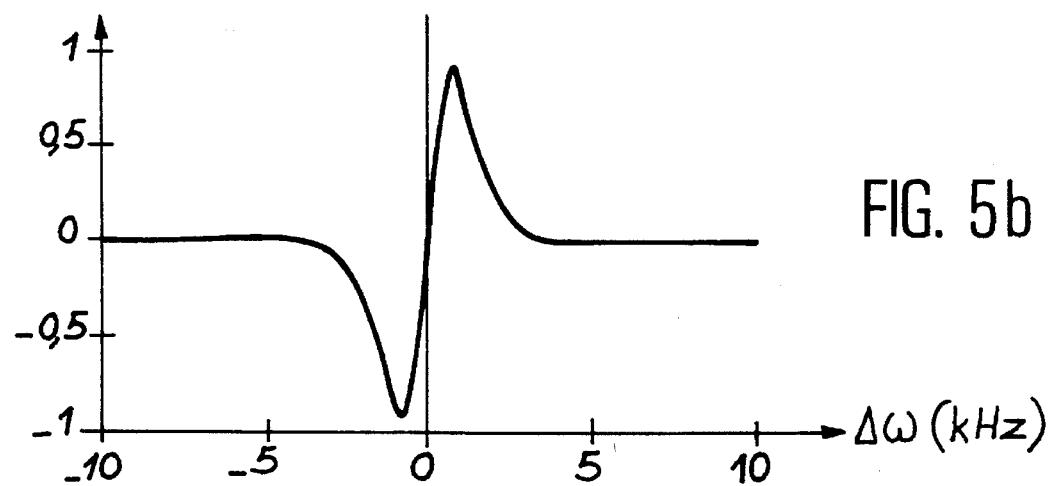

FIGS. 5a and 5b The components, in phase and in quadrature with the reference voltage, of the signal at a frequency equal to twice the Larmor frequency.

Figure 6:
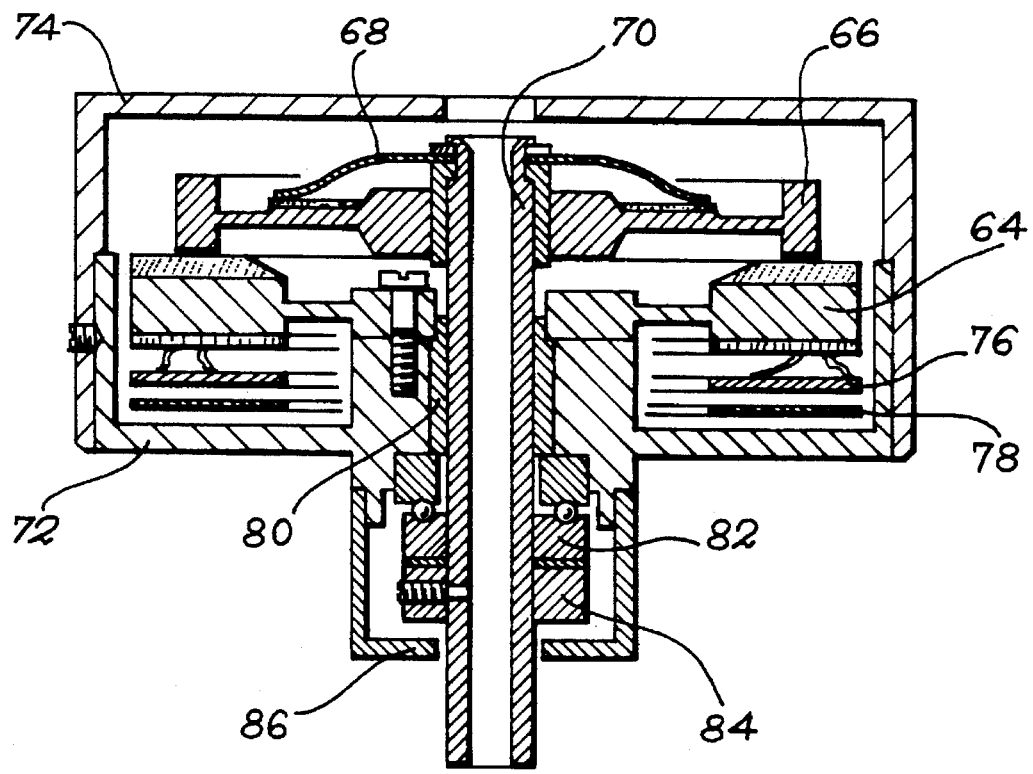

FIG. 6 A piezoelectric motor for a magnetometer according to the invention.

Figure 7:
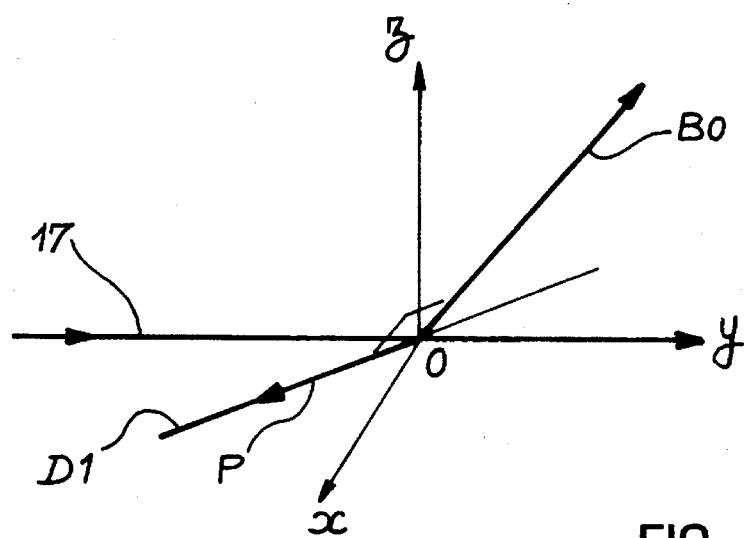

FIG. 7 A diagram showing the relative orientation of the field $\vec{B}_o$ and the polarization $\vec{P}$.

FIGS. 8a, 8b, 8c & 8d Variations of the amplitude of various signals as a function of the angle formed by the polarization direction $\vec{P}$ with the ambient magnetic field $\vec{B}_o$.

A magnetometer according to a preferred embodiment of the invention is shown in FIG. 3. This magnetometer incorporates means already shown in FIGS. 1 and 2 and which therefore carry the same references. They consist of the cell 10 filled with gas 12, the laser 14 emitting a beam 15, the polarizer 16 supplying a linearly polarized beam 17, the photodetector 24 receiving the emergent beam 16, the frequency coupling circuit 21, the radio frequency generator 22, the frequency meter 26 and the discharge circuit 30. The generator 22 controls the current induced in a coil 56 positioned in the vicinity of the cell 12 so as to produce in the latter a radio frequency field $\vec{B}_1$. The coil 56 and the polarizer 16 are mechanically joined in such a way that any rotation of angle θ applied to the polarizer leads to a rotation by the same angle of the direction of the field $\vec{B}_1$, the intensity of the latter being defined by the generator 22. Advantageously, for linking the means 56 and 22, use is made of a rotary contact, e.g. a contact by capacitive coupling or by a transformer, whose primary winding is fixed and whose secondary winding is mobile. Preferably, the coil and the polarizer are installed in such a way that the polarization $\vec{P}$ and the field $\vec{B}_1$ are parallel.

The coil—polarizer arrangement is more particularly shown in FIG. 4. The polarizer 16 is installed in the centre of a ring support 60, which is hollowed out in its central portion. The coil 56 is installed on a hollow cylinder 62. For joining the two together, it is merely necessary to fit the ring on the end of the cylinder, e.g. using amagnetic screws.

It should be noted that the signal detected by the photodetector 24 comprises, apart from a continuous component $A_o$, two components $A_1$ and $A_2$, respectively at the Larmor frequency and double the Larmor frequency. Moreover, each component $A_1$ and $A_2$ is complex and it is convenient to represent them by their component in phase and in phase quadrature with a reference signal $V_{RF}$ at the Larmor frequency produced by the generator 22. Thus, FIGS. 5a and 5b show the components in phase and in phase quadrature of $A_2$ (term at twice the frequency of the Larmor frequency) as a function of the variation between the exciting frequency o and the Larmor frequency. It should be noted that the component in quadrature has an anti-symmetrical, virtually linear, central portion.

No phase variation due to the variation of the angle ($\vec{P}, \vec{B}_1$) can influence the amplitude of the component of $A_1$ in quadrature with the reference voltage, which is detected by the circuit 42. Thus, as a result of the joining together of the polarizer and the coil, a constant and preferably zero angle is maintained between $\vec{P}$ and $\vec{B}_1$. It is precisely the variation of this angle which, without the joining together, would lead to a variation of the phases of $A_1$ and $A_2$.

The motor 46 used for controlling the polarizer 16 will be sufficiently powerful to be able to carry out a rotation of the assembly of the polarizer, coil and joining means. However, it is also necessary to respect the highly restrictive constraints of amagnetism. Thus, one of the specifications of the magnetometer is that the measurement of the magnetic field must be independent of the orientation of the sensor with respect to said field. It is therefore fundamental not to bring any magnetic element or requiring a supply by a direct current into the vicinity of the probe, because such components would generate during probe rotations magnetic signatures and therefore measurement errors with respect to the geomagnetic field, whose magnitude would vary as a function of the arrangement of the magnetometer. Bearing in mind these constraints, a piezoelectric motor has been chosen.

More specifically the piezoelectric motor used is illustrated in FIG. 6. The operation of this type of motor is based on the exploitation of the movements generated on the surface of a stator, which are in the form of a vibration-excited "elastic" body. A rotor 66 engaged with the stator by the bias of a spring 68 is driven by friction with the stator. For the invention, the assembly of the motor 46 took place with a hollow shaft 70 in order to permit the transmission of the light beam through the apparatus. Both the rotor 66 and the stator 64 are annular and the mechanical support 16 and the means 56 for exciting the radio frequency field are joined to the motor by means of the shaft of the latter. Thus, the mechanical support 60, 62 is rotated by the motor 46, the control of the speed and the rotation direction of the rotor 66 taking place by the bias of the electrical excitation applied to a piezoelectric transducer used for creating on the surface of the stator 64 the travelling wave which gives rise to angular displacements of the rotor. In FIG. 6, the references 72 and 74 respectively represent a case and its cover, the reference 76 a table, the reference 78 a rubber protection. The shaft 70 passes into a bearing 80. The assembly is located between the spring 68 and a ceramic abutment 82, the reference 84 designating a thrust collar and the reference 86 an abutment protection.

The magnetometer comprises a circuit 40 for the coupling or control of the direction of the polarizer 16. This circuit comprises a first synchronous detection circuit 42 receiving the electric signal supplied by the photodetector 24 and a reference voltage $V_{RF}$ from the generator 22. This circuit 42 detects the amplitude $A_{1\ q}$ of the component in phase quadrature with the reference signal $V_{RF}$. For reasons which will become clearer in connection with FIG. 8d, said amplitude $A_1$ serves as the error signal which, once amplified by an amplifier 44, supplies the motor 46, which rotates the polarizer 16 in a direction such that the error signal is cancelled out. The rotation of the polarizer 16 brings about the rotation of the coil 56 due to the mechanical junction between the polarizer and the coil.

FIG. 7 illustrates the function fulfilled by the control circuit 40. The directions are designated with respect to a system of trirectangular axes Oxyz. The light beam 17 propagates along the axis Oy. The linear polarization $\vec{P}$ of this beam is therefore located in the plane xOz. The ambient magnetic field $\vec{B}_o$ is directed in a random direction. Therefore the control means 40 also have the function of giving to the polarization the direction $D_1$ perpendicular to Bo.

The radio frequency field $\vec{B}_1$ is assumed as oriented parallel to D1, as a result of the mechanical joining of the polarizer and the coil. When the polarization $\vec{P}$ is perpendicular to $\vec{B}_o$, $\vec{B}_1$ is also perpendicular to $\vec{B}_o$.

It should be noted that no matter what the direction of $\vec{B}_o$, there is always a direction of the plane xOz, which is perpendicular to $\vec{B}_o$. During a complete rotation of the polarizer 16, it is certain that the polarization direction $\vec{P}$ will pass through a position at 90° from $\vec{B}_o$. Thus, the minimum angle formed by $\vec{B}_o$ with a straight line of the plane xOz is equal to $(\pi/2)-\theta n$ if $\theta n$ designates the angle formed by the perpendicular to the plane xOz (in other words the Oy axis) with the field $\vec{B}_o$. The maximum angle is equal to $(\pi/2)+\theta n$. During a rotation by 360° of the polarizer, the angle formed by the polarization direction $\vec{P}$ with $\vec{B}_o$ will thus vary between $(\pi/2)-\theta n$ and $(\lambda/2)+\theta n$, so that there will be necessarily a passage through $\pi/2$.

It is pointed that the signal detected by the photodetector 14 has, in addition to a continuous term $A_o$, spectral components $A_1$ and $A_2$ respectively at the Larmor frequency and double the Larmor frequency.

FIGS. 8a to 8d show the variations of certain signals as a function of the angle θ formed by the polarization direction with the direction of the magnetic field to be measured $\vec{B}_o$.

In FIG. 8a, the amplitude $A_o$ is the amplitude of the continuous component of the signal, which is in $(3\cos^2\theta-1)^2$. This component is zero for an angle of approximately 54°. It is at a maximum for θ=90° and 0° (if θ=90° can always be reached, as explained hereinbefore, this is not also always the case for the value 0 which can only be reached if Bo is in the plane xOz).

FIG. 8b shows the absolute value $|A_{1\ q}|$ of the amplitude of the component at the Larmor frequency and in phase quadrature with the radio frequency signal. This component is in $|\sin^2\theta(3\cos^2\theta-1)|$. It is cancelled out for θ=0 and 90° and also for 54°.

FIG. 8c shows the absolute value $|A_2|$ of the amplitude of the component at twice the Larmor frequency. This component is in $|\sin^2\theta(1-3\cos^2\theta)|$. It is cancelled out for θ=0 and 54° and passes through a maximum for θ=90°.

Finally, FIG. 8d shows the amplitude $A_{1\ q}$, in quantity and in sign, which is the coupling signal intended for the circuit 42.

It can be seen that the signal $A_{1\ q}$ at the Larmor frequency, by its cancelling out and sign change for θ=90°, constitutes a convenient error signal making it possible to obtain a coupling of the polarization at 90° of the field B However this signal is also cancelled out for angle 0 and 54°, so that there is a risk of the polarization direction being attached to these inopportune values. To avoid this risk, joint use will be made of the fact that the signal at the double frequency (FIG. 8c) has a maximum for θ=90°, which makes it possible to distinguish this value from the two other values (0 at 54°) where $|A_2|$ is zero. It is also not necessary to ensure that the signal $|A_2|$ is at a maximum. It is merely necessary to verify that it is not zero, i.e. in practice that it exceeds a certain threshold.

Therefore polarization coupling takes place by verifying that two conditions are simultaneously satisfied, namely $A_1$ $q$ zero and $A_2$ exceeding a certain threshold. This double function is ensured in the circuit 40, e.g. by a comparator 41, which compares $A_2$ with a threshold s and by a logic AND gate 45, which only supplies a control signal to the motor 46 if $A_2$ exceeds the threshold.

This property of the double frequency signal can only be exploited on starting up the magnetometer in order to link the polarization $\vec{P}$ with the value 90°. Then, if the field $\vec{B}_o$ changes direction, the polarization will remain coupled to the correct direction.

As soon as use is made of the double frequency signal $A_2$, it is advantageous to use said same signal for the frequency coupling of the magnetometer using means 21, which control the generator 22. Preferably use is made for this purpose of the component of $A_2$ in quadrature (that shown in FIG. 5b) relative to the reference signal, its central antisymmetrical, linear portion being suitable for such a measurement. In addition, no phase variation due to a variation of the angle $(\vec{P}, \vec{B}_1)$ can influence said component because $\vec{P}$, $\vec{B}_1$ are kept parallel by the mechanical joining together of the polarizer and the coil.

The circuit 21 can also supply a signal reflecting the amplitude $|A_2|$ of the component at double the frequency intended for the comparator 41 which will make use of this information to validate the error signal $A_{1\ q}$ by means of the comparator 41.

We claim:

1. Optical pumping, resonance magnetometer comprising:
a cell filled with a gas, whereof the atoms have a gyromagnetic ratio γ, said cell being placed in an ambient magnetic field ($\vec{B}_o$), to be measured, a light source emitting a light beam, a linear polarizer through which said beam passes and giving said beam a linear polarization in a first direction, the linearly polarized beam then passing through the cell, a photodetector receiving the light beam which has passed through the cell, said photodetector supplying an electric signal, means for applying a radio frequency field ($\vec{B}_1$) to the cell, said certain field having a second direction and a certain frequency, means for coupling said frequency to the Larmor frequency F=γBo, a means for measuring said frequency, the amplitude of the ambient magnetic field ($\vec{B}_o$) being derived from the frequency F by the relation $B_0=F/\gamma$, said magnetometer further comprising means for mechanically joining to the polarizer the means for applying the radio frequency field ($\vec{B}_1$) to the cell and coupling means acting on the mechanical joining means, said coupling means having a synchronous detection circuit receiving the electric signal supplied by the photodetector and a reference voltage ($V_{RF}$) at the frequency F of the radio frequency signal, said circuit detecting the amplitude ($A_{1\,q}$) of the component at frequency F, in phase quadrature with the reference signal ($V_{RF}$), said amplitude being used for controlling means for rotating the mechanical joining means of the polarizer with means for applying the radio frequency field to the cell.

2. Magnetometer according to claim 1, wherein the synchronous detection circuit also verifies that the amplitude $|A_2|$ of the signal at double the Larmor frequency is not zero.

3. Magnetometer according to either of the claims 1 and 2, the linear polarization direction of the beam being parallel to the direction of the radio frequency field ($\vec{B}_1$).

4. Magnetometer according to either of the claims 1 and 2, the radio frequency generating means being constituted by a single coil.

5. Magnetometer according to either of the claims 1 and 2, the means for rotating the assembly constituted by the polarizer and the means for generating the radio frequency field being constituted by a piezoelectric motor.

* * * * *